United States Patent
Nitta et al.

(10) Patent No.: US 9,673,087 B2
(45) Date of Patent: *Jun. 6, 2017

(54) INTERCONNECT STRUCTURES INCORPORATING AIR-GAP SPACERS

(71) Applicant: International Business Machines Corporation, Armonk, NY (US)

(72) Inventors: Satya V. Nitta, Armonk, NY (US); Shom Ponoth, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/846,801

(22) Filed: Sep. 6, 2015

(65) Prior Publication Data

US 2016/0197002 A1 Jul. 7, 2016

Related U.S. Application Data

(60) Continuation of application No. 13/083,550, filed on Apr. 9, 2011, now Pat. No. 9,305,882, which is a
(Continued)

(51) Int. Cl.
*H01L 23/52* (2006.01)
*H01L 21/768* (2006.01)
(Continued)

(52) U.S. Cl.
CPC .. *H01L 21/76807* (2013.01); *H01L 21/31111* (2013.01); *H01L 21/7682* (2013.01); *H01L 21/76802* (2013.01); *H01L 21/76808* (2013.01); *H01L 21/76826* (2013.01); *H01L 21/76829* (2013.01); *H01L 21/76831* (2013.01); *H01L 21/76832* (2013.01); *H01L 21/76834* (2013.01);
(Continued)

(58) Field of Classification Search
CPC ......... H01L 21/76802; H01L 21/76807; H01L 21/7682; H01L 21/76829; H01L 21/76834; H01L 23/48; H01L 23/481; H01L 23/52; H01L 23/522; H01L 23/5222; H01L 23/5226
USPC ....................... 438/629, 637, 639, 672, 675; 257/758–760, 773, 774
See application file for complete search history.

(56) References Cited

U.S. PATENT DOCUMENTS

| | | | |
|---|---|---|---|
| 9,305,882 B2* | 4/2016 | Nitta | H01L 21/76808 |
| 2004/0099951 A1* | 5/2004 | Park | B81B 7/0006 |
| | | | 257/758 |
| 2006/0073695 A1* | 4/2006 | Filippi | H01L 21/76807 |
| | | | 438/619 |

* cited by examiner

*Primary Examiner* — Matthew E Warren

(57) ABSTRACT

A dual damascene article of manufacture comprises a trench containing a conductive metal column where the trench and the conductive metal column extend down into and are contiguous with a via. The trench and the conductive metal column and the via have a common axis. These articles comprise interconnect structures incorporating air-gap spacers containing metal/insulator structures for Very Large Scale Integrated (VLSI) and Ultra Large Scale Integrated (ULSI) devices and packaging. The trench in this regard comprises a sidewall air-gap immediately adjacent the side walls of the trench and the conductive metal column, the sidewall air-gap extending down to the via to a depth below a line fixed by the bottom of the trench, and continues downward in the via for a distance of from about 1 Angstrom below the line to the full depth of the via. In another aspect, the article of manufacture comprises a capped dual damascene structure.

17 Claims, 5 Drawing Sheets

Related U.S. Application Data division of application No. 11/855,211, filed on Sep. 14, 2007, now abandoned.

(51) Int. Cl.
*H01L 23/48* (2006.01)
*H01L 23/522* (2006.01)
*H01L 23/532* (2006.01)
*H01L 21/311* (2006.01)

(52) U.S. Cl.
CPC ........ *H01L 21/76877* (2013.01); *H01L 23/48* (2013.01); *H01L 23/481* (2013.01); *H01L 23/52* (2013.01); *H01L 23/522* (2013.01); *H01L 23/5222* (2013.01); *H01L 23/5226* (2013.01); *H01L 23/5329* (2013.01); *H01L 23/53238* (2013.01); *H01L 23/53295* (2013.01); *H01L 2221/1063* (2013.01); *H01L 2924/0002* (2013.01)

INTERCONNECT STRUCTURES INCORPORATING AIR-GAP SPACERS

The present application is a Continuation Application of U.S. patent application Ser. No. 13/083,550, filed Apr. 9, 2011, which is a Divisional Application of U.S. patent application Ser. No. 11/855,211, filed Sep. 14, 2007, the contents of both of which are incorporated herein by reference in their entirety.

FIELD OF THE INVENTION

The field of the invention comprises semiconductor device manufacturing and more specifically to methods of forming air-gap containing metal/insulator interconnect structures for Very Large Scale Integrated (VLSI) and Ultra Large Scale Integrated (ULSI) devices and packaging.

BACKGROUND OF THE INVENTION

Device interconnections in Very Large Scale Integrated (VLSI) or Ultra-Large Scale Integrated (ULSI) semiconductor chips typically have multilevel structures containing patterns of metal wiring layers encapsulated in an insulator. Wiring structures within a given level of wiring are separated by an intra level dielectric, while the individual wiring levels are separated from each other by layers of an inter level dielectric, conductive vias are formed in the inter level dielectric to provide inter level contacts between the wiring traces.

Because of their effects on signal propagation delays, the materials and layout of these interconnect structures can substantially impact chip speed, and thus chip performance. Signal-propagation delays are due to RC time constants wherein "R" is the resistance of the on-chip wiring, and "C" is the effective capacitance between the signal lines and the surrounding conductors in the multilevel interconnection stack. RC time constants are reduced by lowering the specific resistance of the wiring material, and by using inter level and intra level dielectrics (ILDs) with lower dielectric constants, k.

The common terminology used to classify ILDs by their dielectric constant falls into four categories: standard k (4.5k<10), low k (k<3.0), ultra low k (2.0k<<2.5), and extreme low k (k<2.0). Ultra low k and extreme low k dielectrics generally tend to be porous with intentionally engineered voids in their structure. Since the lowest dielectric constant possible comprises air or vacuum ($k_{vac}$=1) the industry has developed means to produce voids in the dielectric. When the void volume extends and occupies substantial contiguous regions of the gaps between the lines of wires of a chip device, one achieves an interconnect structure where these lines are nominally separated by air or vacuum as the ILD material. We employ the term "air bridge" to describe such an interconnect structure to distinguish it from structures which employ a porous ILD with void volume dispersed randomly within a nominally contiguous solid dielectric.

An example of a metal/dielectric combination for low RC interconnect structures comprises copper metal with a dielectric such as $SiO_2$ (k~4.0). Due to difficulties in subtractively patterning copper, copper-containing interconnect structures are typically fabricated by a damascene process. In a typical damascene process, conductive metal patterns, which are inset in a layer of dielectric, are formed by the steps of: (i) etching holes (for vias) or trenches (for wiring) into the inter level or intra level dielectric; (ii) optionally, lining the holes or trenches with one or more adhesion or diffusion barrier layers; (iii) overfilling the holes or trenches with a conductive metal wiring material such as copper, although other metals may be used in this regard such as aluminum, gold, silver, tin, alloys thereof and combinations thereof including combinations with copper and alloys of copper. This is followed by step (iv), removing the metal overfill by a planarizing process such as chemical-mechanical polishing (CMP), leaving the metal even with the upper surface of the dielectric.

Commercial processes can repeat these steps until the desired number of wiring and via levels have been fabricated. Fabrication of interconnect structures by damascene processing can be substantially simplified by using a process variation known as dual damascene, in which patterned cavities for the wiring level and its underlying via level are filled in with metal in the same deposition step. Dual damascene reduces the number of metal polishing steps by a factor of two, providing substantial cost savings, but requires introduction of a dual-relief pattern in the combined via and wiring level dielectric.

In a typical DD process, an inter-metal dielectric (IMD) is coated on a substrate and comprises a via level dielectric and line level dielectric. These two layers can be made of the same or different insulating films and in the former case applied as a single monolithic layer. A hard mask layer or a layered stack is optionally employed to facilitate etch selectivity and to serve as a polish stop. The wiring interconnect network consists of two types of features: line features that traverse a distance across the chip, and the via features which connect lines in different levels of interconnects in a multilevel stack together. Historically, both layers are made from an inorganic glass like silicon dioxide ($SiO_2$) or a fluorinated silica glass (FSG) film deposited by plasma enhanced chemical vapor deposition (PECVD).

Wolf, "Introduction to Dual-Damascene Processes," *Silicon Processing For the VLSI Era*, Vol. 4, pp. 674-79, Lattice Press (2004); Yen et al., U.S. Pat. No. 5,801,094; Wang et al. WO 2004/053948 A3; Woo, U.S. Pat. No. 7,015,149; Colburn, U.S. Pat. No. 7,071,097; and Gambino, et al., United States Patent Publication 20060172514, Aug. 3, 2006 also describe dual damascene processes.

Low-k alternatives to $SiO_2$ comprise carbon-based solid materials such as diamond-like carbon (DLC), also known as amorphous hydrogenated carbon (a-C:H), fluorinated DLC (FDLC), SiCO or SiCOH compounds, and organic or inorganic polymer dielectrics. Nanoporous versions of $SiO_2$ and the above-mentioned carbon-based materials have even lower k values, while air-gaps have the lowest k values of any material (k~1.00). (Note that the air in the air-gap may comprise any gaseous material or vacuum.) Havemann, et al, U.S. Pat. No. 5,461,003; Grill, et al., U.S. Pat. No. 5,869,880; and Chang, et al. U.S. Pat. No. 5,559,055 describe multilayer interconnect structures incorporating air-gaps. Additionally, Wang et al. WO 2004/053948 A3 and Colburn et al. U.S. Pat. No. 6,930,034 describe methods of placing air-gaps or "air bridges" in a semiconductor chip, or semiconductor array, or wafer, or integrated circuit (IC) components.

One prior art method for forming air-gaps utilizes a sacrificial place-holder (SPH) material which is removed or extracted from beneath a solid or semi-permeable bridge layer. Examples of SPH materials and removal methods comprise poly(methylmethacrylate) (PMMA), poly-para-xylylene (Parylene™), amorphous carbon, and polystyrene, which may be removed by organic solvents, oxygen ashing, and/or low temperature (~200° C.) oxidation, and norbornene-based materials such as BF Goodrich's Unity Sacrificial Polymer™, which may be removed by low temperature (350°-400° C.) thermal decomposition into volatiles. In the case of the Unity material, the volatile decomposition by-product actually diffuses through the bridge layer, as demonstrated by Kohl et al., Electrochemical and Solid-State Letters 1 49 (1998) for structures comprising $SiO_2$ (500 nm) bridge layers deposited by a low temperature plasma enhanced chemical vapor deposition (PECVD) process.

In all these cases, the removal medium, (plasma, a wet chemical, or SPH material), is required to diffuse through the semi-permeable bridge layer. This is generally very difficult to achieve.

Lee et al., U.S. Pat. No. 6,228,763 teach the use of spacers to form air-gaps adjacent to metal structures in an interconnect scheme. However, in their structure, they claim that the nature of their scheme ensures that the metal structure is curved outward since it closely follows the contours of the spacer. This is an undesirable structure since it could lead to high field concentrations around the curved parts and poor breakdown behavior of the interconnect, a significant drawback. In addition, they propose the use of a single damascene scheme to form their structure. This makes their scheme very expensive and limits the performance due to their inability to extend the air-gap below the trench to obtained increased performance. Finally, in their scheme, they use plasma based methods to remove the dielectric spacer to form the air-gap and they do this with the metal interconnect already present in the structure which could lead to a degradation of the conductive properties of the interconnect.

Lee et al., U.S. Pat. No. 6,329,279 solve one of the problems they encounter in U.S. Pat. No. 6,228,763, namely the high field concentrations around the curved parts of the top of the metal line by means of a new structure; however, their gap is narrowest adjacent to the top of the metal line where it is most desirable to reduce the dielectric constant due to the presence of the relatively high k barrier layer immediately above it. The other drawbacks mentioned above for U.S. Pat. No. 6,228,763 still remain, the chief of which is that this is based on a single damascene integration scheme which is prohibitively expensive, limited in performance, and not extendible readily to any interconnect scheme in the industry which uses Cu based metallurgy.

Geffken et al., United States Patent Publication 2005/0067673 A1, also teach a method to obtain air-gaps, but indicate a drawback by noting "that since these second spacers have reduced the size of the trench openings 56, 58 and via openings 52, 54, then initially formed, the trench and via photo needs to be exposed and etched larger by about two times the spacer width." (Geffken et al. par. [0025]). This is very difficult to achieve, especially as the structure gets closer to the tens of nanometer dimensions because this calls for a lithography process where the pitch remains the same but the openings are enlarged by twice the spacer width which makes the lithography process difficult to employ. In addition, due to the lack of a gap below the trench and adjacent to the vias, their performance gain is limited. Finally, since their invention calls for an extra lithography step, in addition to extra wet/SC CO2 etches to remove the damaged dielectric, it is very expensive to practice.

Another concern with air-gap based dielectric structures compared to structures with solid dielectrics is that air-gap based structures have lower thermal conductivity, reduced strength, and higher permeability to moisture and oxygen. Workable schemes for incorporating air-gaps into interconnect structures must take these limitations into account.

In addition structures with air-gaps may not be as uniformly planar as structures built with intrinsically more rigid solid dielectrics. This can be a problem if locally depressed areas are formed by bridge layer sag over unsupported air-gaps, since metal filling these depressed areas will remain in the structure after chemical-mechanical polishing (CMP) and be a source of shorts and/or extra capacitance.

In view of these drawbacks with the prior art processes, there is a continued need for developing a new and improved method by which air-gaps can be formed in an interconnect to minimize or eliminate these problems.

While all of the foregoing provide advancements in the fabrication of air-gaps in semiconductor chips or semiconductor arrays or wafers or IC circuits, collectively referred to hereafter as electronic devices, there is still a need for improved or novel processes, articles of manufacture and products produced by novel processes that provide air-gap structures that eliminate or minimize these and other problems encountered in the art.

SUMMARY OF THE INVENTION

The present invention provides materials and a process or processes for forming an air-gap or air-gaps in electronic devices as described herein, as well as a product produced by such process or processes or articles of manufacture that address these needs, and not only provides advantages over the prior art, but also substantially obviates one or more of the foregoing and other limitations and disadvantages of the prior art.

The written description, abstract of the disclosure, claims, and drawings of the invention as originally set out herein, or as subsequently amended, set forth the features and advantages and objects of the invention, and point out how they may be realized and obtained. Additional objects and advantages of the invention may be learned by practice of the invention.

To achieve these and other advantages and objectives, and in accordance with the purpose of the invention as embodied and described herein, the invention comprises a process for providing air-gaps in an electronic device, a product produced by the process and an article of manufacture comprising such a device according to the written description that follows, the claims, and the Abstract of the Disclosure, and as illustrated in the attached drawings.

In one aspect, the present invention comprises semiconductor device manufacturing and more specifically to methods of forming air-gap containing metal/insulator interconnect structures for Very Large Scale Integrated (VLSI) and Ultra Large Scale Integrated (ULSI) devices and packaging, wherein air-gap spacers, also referred to as sidewall air-gaps in this specification and drawings, are formed in such structures by removing intentionally damaged dielectric material using selective chemical etch means.

The present invention provides a process sequence which will enable formation of self-aligned, spacer-like air-gap interconnect structures. In one embodiment, we start with a silica or organosilicate containing dielectric structure. We carry out the "via-first" dual-damascene etch scheme until the trench etch step. Wolf, "Introduction to Dual-Damascene Processes," *Silicon Processing For the VLSI Era*, Vol. 4, pp. 674-79, Lattice Press (2004) and the other dual damascene prior art we cite herein describe the via first dual damascene process Other dual damascene processes that we employ comprise, the Trench-First, Via-First, and Self-Aligned Dual Damascene processes that Wolf summarizes, and the prior art describes. This invention involves intentionally damaging the dielectric during an "ashing" step and/or the step in which the organic planarizing layer is removed and before a "cap-open" step in which the underlying cap layer is opened. The extent of the damage to the ILD can be controlled by varying etch parameters during the ashing step. Unlike conventional processes, this damaged layer is left in place after etch and is followed by metallization and chemical mechanical planarization (CMP). Subsequent to this, the stack is exposed to a selective etch step such as a dilute HF dip, during which the damaged ILD is removed, leaving behind air-gap structures. The first embodiment relates to cases in which the air-gap width is small enough such that the subsequent cap deposition pinches off leaving behind an air-spacer. The air-gap widths referred to in this embodiment range from about a few nm to less than about 50 nm.

For damaged ILD widths of approximately >30 nm, for which the likelihood of subsequent cap deposition filling the air-gap created after the selective etch is high, we propose a second embodiment of the present invention. The relevant air-width could range from about 30 nm and larger. However, the exact limits depend on the cap deposition method and would be obvious to those skilled in the art. In the second embodiment, the cap layer is deposited following CMP. Perforations are made in the cap layer either by using an optical mask or by using a random self-assembled scheme as outlined by Colburn et al., U.S. Pat. No. 6,911,400. The size of the perforations are such they are big enough for the extraction of the damaged ILD and small enough such that pinch off occurs during cap or next level ILD deposition. The range of the cap perforations can range from, but not limited to, about 10 nm to about 80 nm. The extraction of the damaged ILD is done subsequent to this perforation step. This is followed by the deposition of a second cap layer during which the small perforations facilitates a quick pinch off hence preventing deposition of the cap material inside the air-gaps.

BRIEF DESCRIPTION OF THE DRAWINGS

The features of the invention believed to be novel and the elements characteristic of the invention are set forth with particularity in the written description and claims. The accompanying drawings, incorporated in and which constitute a part of this specification, illustrate single and multiple embodiments of the invention, and together with the other parts of the specification, serve to explain the objects, advantages and principles of the invention. The drawings present figures that are not necessarily drawn to scale. The invention itself, both as to organization and method of operation, may be understood by reference to the written description that follows taken in conjunction with the accompanying drawings in which:

FIGS. 2-7 comprise side elevations in cross section of the process sequence for the formation of the air-gap structures illustrated in the FIG. 1 embodiment of the present invention, wherein:

FIG. 2 comprises an the article of manufacture after trench opening the article of FIG. 1 and before ashing an organic planarizing layer for a "via first" dual damascene process according to the present invention;

FIG. 3. comprises an article of manufacture showing intentional damage to the ILD of the article of FIG. 2 during an ash step, according to the present invention;

FIG. 4. comprises an article of manufacture showing a post cap open step applied to the article of FIG. 3, according to the present invention;

FIG. 5. comprises an article of manufacture showing a structure after metallization and planarization of the article of FIG. 4, according to the present invention;

FIG. 6. comprises an article of manufacture showing air-gap formation by selective removal of damaged regions of the article of FIG. 5, according to the present invention;

FIG. 7. comprises an article of manufacture showing a final structure comprising the capped structure of FIG. 6, demonstrating a single dual damascene build by means of the process of the first embodiment according to the present invention;

FIGS. 8-10 comprise side elevations in cross-section of the process sequence for the formation of the air-gap structures described in a second embodiment of the present invention wherein:

FIG. 8. comprises an article of manufacture showing a second embodiment of the present invention in which a damaged ILD is too wide for efficient pinch-off of the cap, but subsequently remedied according to the present invention;

FIG. 9. comprises an article of manufacture showing a second embodiment of the present invention and illustrates a structure showing post gap patterning and extraction to leave air-gaps in the structure of FIG. 8 according to the present invention;

FIG. 10. comprises an article of manufacture showing a second embodiment of the present invention comprising the final structure of a dual damascene air-gap level formed using the article of FIG. 9 according to the present invention;

DETAILED DESCRIPTION OF THE INVENTION

Figure 1:
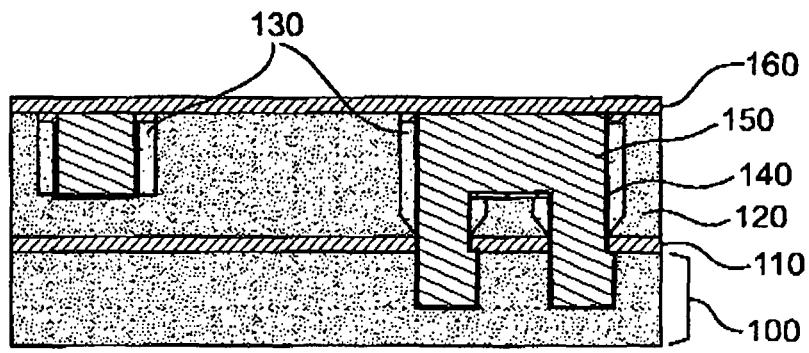
FIG. 1 comprises a side elevation in cross section of an embodiment of the spacer-like, air-gap based interconnect structure of the present invention.

The process sequence used to generate the interconnect structures with air-gap spacers is described with reference to the accompanying drawings. FIG. 1 shows a schematic cross section view of the proposed air-gap interconnect structure, the left side of FIG. 1 illustrating the placement of a trench and the right side, the placement of a combined or stacked trench and via contiguous to one another and having a common axis, with the trench configuration comprising the top of the structure and the via at the bottom. A two level structure is shown with 100 representing an underlying build with a dielectric material 120. A cap layer, 110, is deposited on this level and a dual damascene interconnect build with air-gap spacers is shown. The structure is comprised of the following: 120 is the dielectric material and is a porous or dense material comprised of silica or an organosilicate. The air-gaps are represented by 130 and depending on the metal structure may be limited to the line level or bottom of the trench or may extend all the way to the cap 110 underlying the via. The terms "air-gaps spacers" and "sidewall air-gaps" are used interchangeably in this specification. The metallization is represented by 140 which is a liner material and 150 is copper or any appropriate conductive metal. 160 represent the cap layer and this may partially fill the air-gap as seen in FIG. 1. The various elements of FIG. 1 also carry over to the other Figures of this invention, and such Figures also employ the same numbering of the elements used to describe the elements of FIG. 1. For example, the sidewall air-gap element 130 of FIG. 1 also denotes a sidewall air-gap element 130 in the other Figures of this invention, and likewise for the other elements in the Figures of this invention.

The following describes the process sequence used to fabricate the structure depicted in FIG. 1 and also describes a second or alternate embodiment. It should be noted we claim inter alia the structure in FIG. 1. and the process-sequence described below is an example of how we obtain the novel structure. In addition, depending on the specifics of the processes used, alternate structures will result, where the air-gaps 130 will have different shapes.

Figure 2:
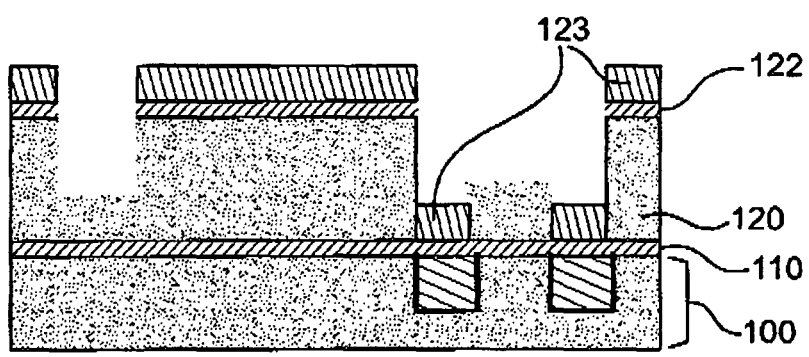

FIG. 2 represents one of the final stages of the via-first dual damascene etch. The steps required to obtain this structure are well documented in the literature and prior art. Here we show the dual damascene process after the trench etch and just before the organic layer ash/strip that is the starting point of our invention. Element 123 is an organic planarizing layer. The via-first scheme described in the prior art employs an ash step to remove the residual organic layer, 123. Great care is taken to minimize damage to the ILD, 120. However, in our invention we diverge from the prior art and intentionally damage the ILD using appropriate ash chemistry. Element 122 is the etch hard mask and is typically a silicon oxide like material.

Figure 3:
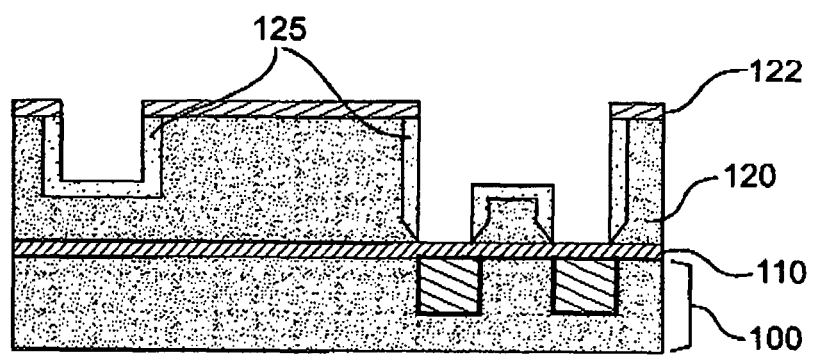

The structure after the ash step is shown in FIG. 3. Element 125 represents the damaged ILD. The organic planarizing layer may also be removed in this step. By damage, we are mainly alluding to removal of the organic parts of the ILD material. Hence, the nature of the damage is essentially chemical in nature and the damaged regions would maintain their physical structure. Example of ashing chemistries which would cause carbon depletion, i.e. chemical damage to the ILD, comprise $O_2/Ar$, $He/H_2$ among others, and combinations thereof. Such choices of the gas chemistries and process condition will be obvious to those skilled in the art. Basically, these ashing or damage chemistries comprise either oxidation or reduction reactions and combinations thereof. The extent and the profile of the chemical damage can be controlled by choice and process conditions of the ash chemistry. Porous ILDs are the preferable dielectric for this invention due the greater possible depth of damage as compared to dense ILDs. For silica or porous silica based ILD, the structure can be exposed to a process that would physically damage or strain the material hence essentially producing a layer 125 that has a substantially faster etch rate in the medium that is described later. In these cases the damage could be physical, chemical or a combination of both. An example of these damaging processes includes exposure to high energy plasma processes.

Figure 4:
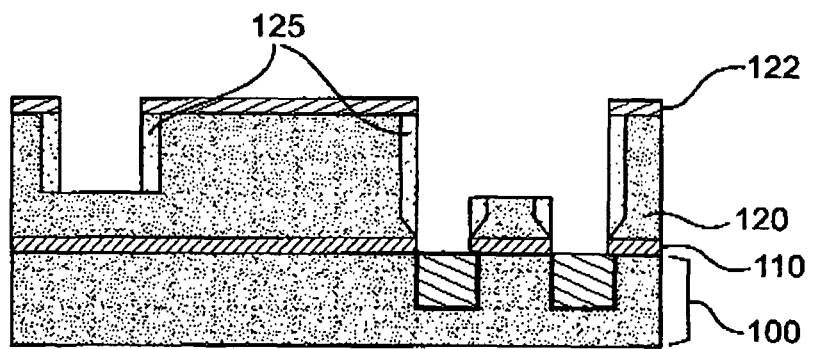

The strip step is usually designed to be selective to the underlying cap layer. This is followed with a cap open chemistry that can etch the damaged ILD, 125, in the horizontal areas and also provide contact to the underlying metal level by etching exposed areas of cap layer 110. The structure after this step is shown in FIG. 4. Note that the trench increases in this step and this increase should be accounted for in the initial trench etch so that target dimensions are achieved.

Figure 5:
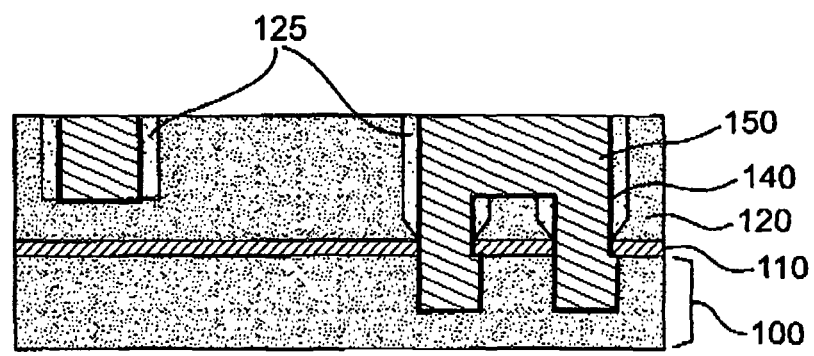

This is followed by liner and seed deposition, copper plating and chemical-mechanical planarization to obtain the structure shown in FIG. 5. Element 140 is the liner and 150 represents the copper fill. The vertical damaged ILD regions, 125, are still part of the structure.

Figure 6:
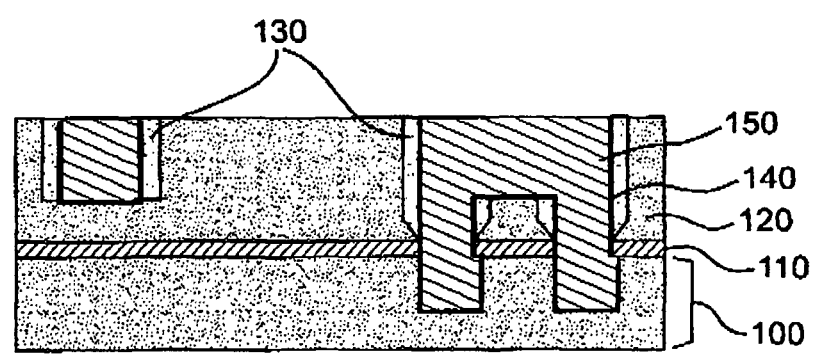

This is followed with a wet extraction step to remove the damaged ILD regions resulting in an air-gap. Examples of the wet chemistries that can be used include dilute hydrofluoric acid (DHF) and ammonium hydroxide. The resultant structure is shown in FIG. 6. Elements 130 are the air-gaps that are formed after the removed of the damaged regions 125 seen in Fig.

Figure 7:
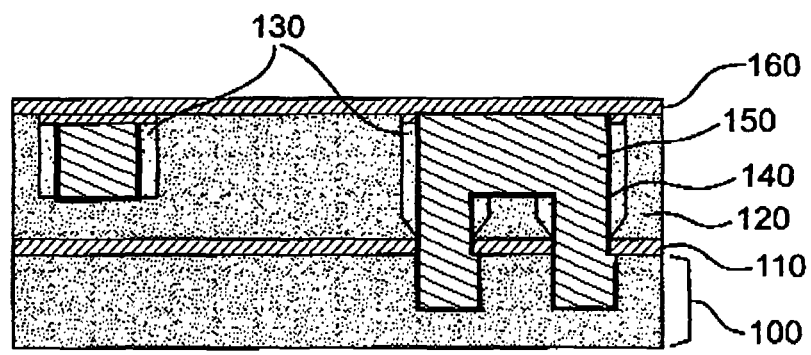

This is followed by the next level cap deposition, 160, and is shown in FIG. 7. In this embodiment of the invention the air-gaps are to be narrow enough such that air-gap openings are pinched off in the initial stages of the cap deposition hence sealing the air-gap and avoiding cap deposition in the air-gaps. Examples of such cap material comprise but are not limited to CVD SiC, CVD SiCN.

Figure 8:
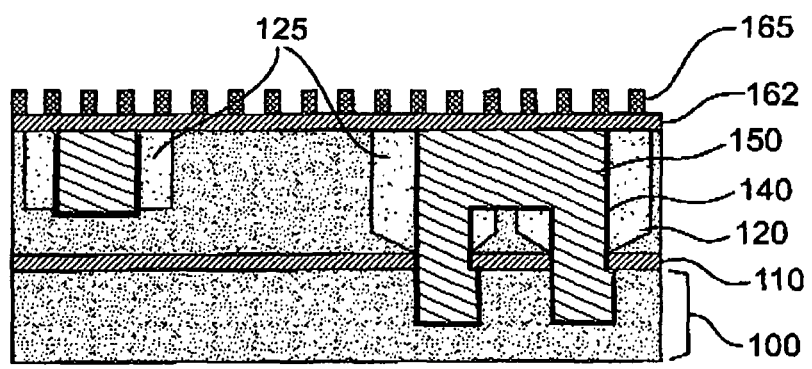

The second embodiment is for the scenario where the gap is too wide for the cap deposition to be able to pinch off without either depositing significant amount of the cap level, typically of a higher dielectric constant, or causing topography issues for the next level. In such cases, as seen in FIG. 8, the damaged ILD region, 125, is wide. In this embodiment, a first cap layer, 162, is deposited immediately after a chemical-mechanical polish step.

Figure 9:
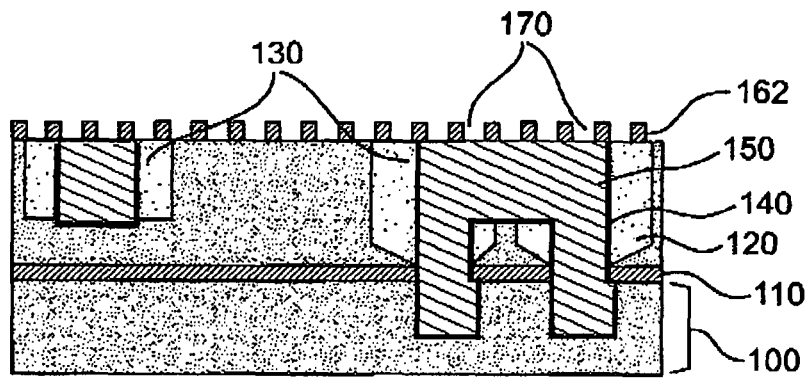

The cap is subsequently patterned with either a self-assembled non-lithographic patterning layer 165 described by Colburn et al. in U.S. Pat. No. 6,911,400 or by lithographic techniques such that narrow gap or gaps are formed right over the damaged regions 125. The structure shown in FIG. 8 represents the former case. Now referring to FIG. 9, Gaps 170, are formed in the cap layer 162 by using a suitable etch process to transfer the patterns in 165 into the cap layer 162. This is followed by an appropriate ashing process to remove the residual patterning layer 165. The wet extraction process outlined in the original embodiment of this invention is used to form air-gaps 130. This time the damaged dielectric regions are extracted out of the structure through the gaps 170 in cap layer 162.

One aspect of the invention comprises a dual damascene article of manufacture that includes a trench containing a conductive metal column, the trench and the conductive metal column extending down into and contiguous with a via, the trench and the conductive metal column and the via having a common axis, wherein the trench further comprises a sidewall air-gap immediately adjacent the side walls of the trench and the conductive metal column, the sidewall air-gap extending down to the via to a depth below a line fixed by the bottom of the trench, and continues downward in the via for a distance of from about 1 Angstrom below the line to the full depth of the via. In a further embodiment the width of the air-gap can vary from about 1 angstrom to about the largest diameter of the trench, or the air-gap comprises an air gap no larger than about 0.5 microns. Further in this regard, and in another embodiment of the invention, the air-gap varies from about 1 Angstrom below the trench to the entire depth of the via.

Another aspect of the invention comprises a dual damascene article of manufacture that includes a trench containing a conductive metal column, the trench and the conductive metal column extending down into and contiguous with a via, the trench and the conductive metal column and the via having a common axis, wherein the trench further comprises a sidewall air-gap immediately adjacent the side walls of the trench and the conductive metal column, the sidewall air-gap extending down to the via, wherein the width of the sidewall air-gap varies from about 1 Angstrom to about 1000 Angstroms, and the via does not have a sidewall air-gap.

Figure 10:
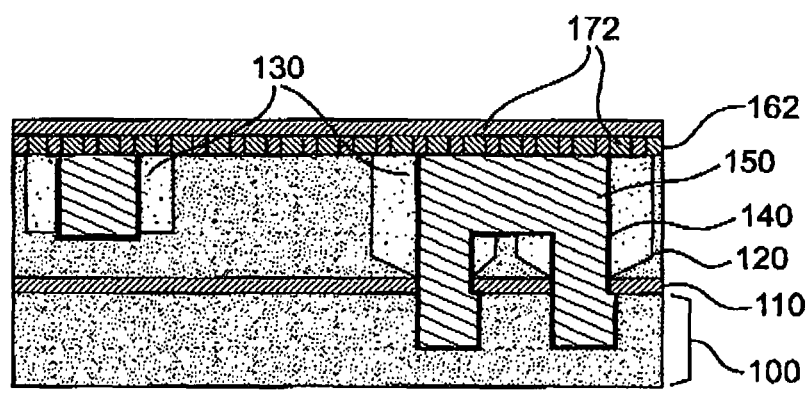

The air-gap 130 formation is followed with deposition of a second cap, 172 as shown in FIG. 10. The gaps 170 are of appropriate dimensions such that pinch-off of the cap layer 172 is obtained hence sealing the previously formed air-gaps 130 thereby producing the final structure for the second embodiment. This may be repeated at other levels to form multilevel dual damascene air-gap levels.

In one embodiment we provide a dual damascene article of manufacture comprising a trench containing a conductive metal column the trench and the conductive metal column extending down into and contiguous with a via, the trench and the conductive metal column and the via having a common axis, wherein the trench further may comprise a sidewall air-gap immediately adjacent the side walls of the trench and the conductive metal column, the sidewall air-gap extending down to the via to a depth below a line fixed by the bottom of the trench, and continues downward in the via for a distance of from about 1 Angstrom below the line to the full depth of the via, and further comprising a pinched off cap operatively associated with the article, the cap being positioned over and projecting into the sidewall air-gap. The dual damascene article of manufacture may comprise a silicon compound ILD selected from a dense silica ILD, a porous silica ILD, a dense organosilicate ILD, or a porous organosilicate ILD. The width of the air-gap may also vary from about 1 angstrom to about the largest diameter of the trench. The air-gap may also comprise an air gap no larger than about 0.5 microns. The depth of the air-gap may also vary from about 1 Angstrom below the trench to the entire depth of the via.

In a further embodiment we provide a dual damascene article of manufacture comprising a trench containing a conductive metal column the trench and the conductive metal column extending down into and contiguous with a via, the trench and the conductive metal column and the via having a common axis, wherein the trench further may comprise a sidewall air-gap immediately adjacent the side walls of the trench and the conductive metal column, the sidewall air-gap extending down to the via, wherein the width of the sidewall air-gap varies from about 1 Angstrom to about 1000 Angstroms, and the via does not have a sidewall air-gap, and further comprising a pinched off cap operatively associated with the article, the cap being positioned over and projecting into the sidewall air-gap.

Another embodiment of our invention comprises a capped dual damascene article of manufacture comprising a trench containing a conductive metal column the trench and the conductive metal column extending down into and contiguous with a via, the trench and the conductive metal column and the via having a common axis, wherein the trench further may comprise a sidewall air-gap immediately adjacent the side walls of the trench and the conductive metal column, the sidewall air-gap extending down to the via, and further comprising a perforated pinched off cap operatively associated with the article, the perforated pinched off cap having seams in it. The width of the air-gap may also vary from about 1 angstrom to about the largest diameter of the trench. The air-gap may also comprise an air gap no larger than about 0.5 microns. The depth of the air-gap may also vary from about 1 Angstrom below the top of the trench to the entire depth of the trench, with the air-gap still being formed adjacent to the trench.

We also provide a capped dual damascene article of manufacture comprising a via and a trench containing a conductive metal column, the trench and the conductive metal column having a common axis, wherein the trench further may comprise a sidewall air-gap immediately adjacent only to the side walls of the trench and the conductive metal column, and further comprising a perforated pinched off cap operatively associated with the article, the perforated pinched off cap having seams in it. The width of the air-gap may also vary from about 1 angstrom to about the largest diameter of the trench. The width of the air-gap may also vary from about 1 angstrom to about the largest diameter of the trench. The air-gap may also comprise an air gap no larger than about 0.5 microns. The depth of the air-gap may also vary from about 1 Angstrom below the trench to the entire depth of the via. The depth of the air-gap may also vary from about 1 Angstrom below the top of the trench to the entire depth of the trench, with the air-gap still being formed adjacent to the trench.

Throughout this specification, and the drawings the inventors have set out equivalents, including without limitation, equivalent elements, materials, compounds, compositions, conditions, processes, structures and the like, and even though set out individually, also comprise combinations of these equivalents such as the two component, three component, or four component combinations, or more as well as combinations of such equivalent elements, materials, compounds, compositions conditions, processes, structures and the like in any ratios.

Additionally, the various numerical ranges describing the invention as set forth throughout the specification also comprises any combination of the lower ends of the ranges with the higher ends of the ranges, and any single numerical value, or any single numerical value that will reduce the scope of the lower limits of the range or the scope of the higher limits of the range, and ranges falling within any of these ranges.

The term "about" or "substantially" as applied to any claim or any parameters herein, such as a numerical value, including values used to describe numerical ranges, means slight variations in the parameter. In another embodiment, the terms "about," "substantial," or "substantially," when employed to define numerical parameter comprise, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit of zero or a miniscule number, e.g., 0.001. The terms "about," "substantial" and "substantially" mean that which is largely or for the most part entirely specified. The inventors also employ the terms "substantial," "substantially," and "about" in the same way as a person with ordinary skill in the art would understand them or employ them. The terms "written description," "specification," "claims," "drawings," and "abstract" as used herein refer to the written description, specification, claims, drawings, and abstract of the present application as originally filed and as subsequently amended. We intend the term "diblock copolymer" as used in the written description and the claims to also comprise triblock copolymers, and block copolymers containing four or five or more block units.

All scientific journal articles and other articles as well as issued and pending patents that this written description mentions including the references cited in such scientific journal articles and other articles, and such patents, are incorporated herein by reference in their entirety for the purpose cited in this written description and for all other disclosures contained in such scientific journal articles and other articles as well as patents and the aforesaid references cited therein, as all or any one may bear on or apply in whole or in part, not only to this written description, but also the abstract, claims, and appended drawings of this application.

Although the inventors have described their invention by reference to some embodiments, other embodiments defined by the doctrine of equivalents are intended to be included as falling within the broad scope and spirit of the foregoing written description, drawings, abstract of the disclosure, and claims as originally presented or subsequently amended.

We claim:

1. A dual damascene article of manufacture comprising a trench containing a conductive metal column said trench and said conductive metal column extending down into and contiguous with a via, said trench and said conductive metal column and said via having a common axis, wherein said trench further comprises a sidewall air-gap immediately adjacent the side walls of said trench and said conductive metal column, said sidewall air-gap extending down to said via to a depth below a line fixed by the bottom of said trench, and continues downward in said via for a distance of from about 1 Angstrom below said line to the full depth of said via, and further comprising a pinched off cap operatively associated with said article, said cap being positioned over and projecting into said sidewall air-gap.

2. The article of manufacture of claim 1 wherein said dual damascene article of manufacture comprises a silicon compound ILD selected from a dense silica ILD, a porous silica ILD, a dense organosilicate ILD, or a porous organosilicate ILD.

3. The article of manufacture of claim 1 wherein the width of said air-gap can vary from about 1 angstrom to about the largest diameter of said trench.

4. The article of manufacture of claim 1 wherein said air-gap comprises an air gap no larger than about 0.5 microns.

5. The article of manufacture of claim 1 wherein said depth of said air-gap varies from about 1 Angstrom below the trench to the entire depth of said via.

6. A dual damascene article of manufacture comprising a trench containing a conductive metal column said trench and said conductive metal column extending down into and contiguous with a via, said trench and said conductive metal column and said via having a common axis, wherein said trench further comprises a sidewall air-gap immediately adjacent said side walls of said trench and said conductive metal column, said sidewall air-gap extending down to said via, wherein said width of said sidewall air-gap varies from about 1 Angstrom to about 1000 Angstroms, and said via does not have a sidewall air-gap, and further comprising a pinched off cap operatively associated with said article, said cap being positioned over and projecting into said sidewall air-gap.

7. The article of manufacture of claim 6 wherein the width of said air-gap can vary from about 1 angstrom to about the largest diameter of said trench.

8. The article of manufacture of claim 6 wherein said air-gap comprises an air gap no larger than about 0.5 microns.

9. The article of manufacture of claim 6 wherein the depth of said air-gap varies from about 1 Angstrom below the top of said trench to the entire depth of said trench, with said air-gap still being formed adjacent to said trench.

10. A capped dual damascene article of manufacture comprising a trench containing a conductive metal column said trench and said conductive metal column extending down into and contiguous with a via, said trench and said conductive metal column and said via having a common axis, wherein said trench further comprises a sidewall air-gap immediately adjacent said side walls of said trench and said conductive metal column, said sidewall air-gap extending down to said via, and further comprising a perforated pinched off cap operatively associated with said article, said perforated pinched off cap having seams in it.

11. The article of manufacture of claim 10 wherein the width of said air-gap can vary from about 1 angstrom to about the largest diameter of said trench.

12. The article of manufacture of claim 10 wherein said air-gap comprises an air gap no larger than about 0.5 microns.

13. The article of manufacture of claim 10 wherein said depth of said air-gap varies from about 1 Angstrom below the trench to the entire depth of said via.

14. A capped dual damascene article of manufacture comprising a via and a trench containing a conductive metal column, said trench and said conductive metal column having a common axis, wherein said trench further comprises a sidewall air-gap immediately adjacent only to the side walls of said trench and said conductive metal column, and further comprising a perforated pinched off cap operatively associated with said article, said perforated pinched off cap having seams in it.

15. The article of manufacture of claim 14 wherein the width of said air-gap can vary from about 1 angstrom to about the largest diameter of said trench.

16. The article of manufacture of claim 14 wherein said air-gap comprises an air gap no larger than about 0.5 microns.

17. The article of manufacture of claim 14 wherein the depth of said air-gap varies from about 1 Angstrom below the top of said trench to the entire depth of said trench, with said air-gap still being formed adjacent to said trench.

* * * * *